US010370940B2

(12) United States Patent
Ranjan et al.

(10) Patent No.: US 10,370,940 B2
(45) Date of Patent: *Aug. 6, 2019

(54) SYSTEMS AND METHODS FOR SUBSURFACE OIL RECOVERY OPTIMIZATION

(71) Applicant: Landmark Graphics Corporation, Houston, TX (US)

(72) Inventors: Priyesh Ranjan, Houston, TX (US); Sheldon Burt Gorell, Katy, TX (US); Amit Kumar, Houston, TX (US); Alvin Stanley Cullick, Thornton, CO (US); Gustavo A. Carvajal, Houston, TX (US); Karelis Alejandra Urrutia, Houston, TX (US); Hasnain Khan, Houston, TX (US); Luigi Alfonso Saputelli, Houston, TX (US); Hatem Nasr, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 1269 days.

This patent is subject to a terminal disclaimer.

(21) Appl. No.: 14/350,000

(22) PCT Filed: Oct. 5, 2012

(86) PCT No.: PCT/US2012/058843
§ 371 (c)(1),
(2) Date: Apr. 4, 2014

(87) PCT Pub. No.: WO2013/052725
PCT Pub. Date: Apr. 11, 2013

(65) Prior Publication Data
US 2014/0229151 A1  Aug. 14, 2014

Related U.S. Application Data

(60) Provisional application No. 61/544,202, filed on Oct. 6, 2011.

(51) Int. Cl.
*G06G 7/48* (2006.01)
*E21B 43/00* (2006.01)
(Continued)

(52) U.S. Cl.
CPC .......... *E21B 43/00* (2013.01); *E21B 41/0092* (2013.01); *E21B 43/16* (2013.01);
(Continued)

(58) Field of Classification Search
CPC .......... E21B 43/00; E21B 43/12; E21B 43/14; E21B 43/16; E21B 43/30; E21B 41/0092;
(Continued)

(56) References Cited

U.S. PATENT DOCUMENTS

| 6,775,578 B2 | 8/2004 | Couet et al. |
| 7,953,585 B2 | 5/2011 | Pantella et al. |

(Continued)

FOREIGN PATENT DOCUMENTS

| CN | 1549885 | 11/2004 |
| CN | 1566991 | 1/2005 |

(Continued)

OTHER PUBLICATIONS

M. Thiele, et al., "Using Streamline-Derived Injection Efficiencies for Improved Waterflood Management," SPE Reservoir Evaluation and Engineering, Apr. 2006, vol. 9, No. 2, pp. 187-196.*

(Continued)

*Primary Examiner* — Andre Pierre Louis
(74) *Attorney, Agent, or Firm* — Kilpatrick Townsend & Stockton LLP

(57) ABSTRACT

Systems and methods for subsurface secondary and/or tertiary oil recovery optimization based on either a short term, medium term or long term optimization analysis of selected zones, wells, patterns/clusters and/or fields.

22 Claims, 15 Drawing Sheets

(51) Int. Cl.
| | |
|---|---|
| *G06Q 10/06* | (2012.01) |
| *E21B 41/00* | (2006.01) |
| *E21B 43/16* | (2006.01) |
| *G01V 99/00* | (2009.01) |
| *G06Q 50/02* | (2012.01) |
| *G06F 17/50* | (2006.01) |

(52) U.S. Cl.
CPC ....... *G01V 99/005* (2013.01); *G06Q 10/0637* (2013.01); *G06Q 10/06375* (2013.01); *G06Q 50/02* (2013.01); *G06F 17/50* (2013.01); *G06F 17/5009* (2013.01)

(58) Field of Classification Search
CPC .......... C09K 8/584; C09K 8/58; C09K 8/524; C09K 8/602; C09K 8/607; C09K 8/92; G06Q 10/06; G06Q 10/0637; G01V 2210/66; G01V 99/005; G05B 13/04; G06F 17/5009
USPC ....................................................... 703/9, 10
See application file for complete search history.

(56) References Cited

U.S. PATENT DOCUMENTS

| | | | |
|---|---|---|---|
| 7,953,587 B2* | 5/2011 | Bratton ................... | E21B 43/00 703/10 |
| 7,963,327 B1 | 6/2011 | Saleri et al. | |
| 7,966,166 B2 | 6/2011 | Thambynayagam et al. | |
| 8,744,817 B2* | 6/2014 | Habashy ................. | E21B 43/00 703/10 |
| 2004/0073438 A1 | 4/2004 | Fox et al. | |
| 2005/0149307 A1 | 7/2005 | Gurpinar et al. | |
| 2006/0224369 A1 | 10/2006 | Yang et al. | |
| 2007/0156377 A1 | 7/2007 | Pantella et al. | |
| 2008/0091283 A1* | 4/2008 | Balci ...................... | G06Q 10/06 700/90 |
| 2008/0234939 A1 | 9/2008 | Foot et al. | |
| 2008/0288226 A1* | 11/2008 | Gurpinar ................. | E21B 43/00 703/10 |
| 2008/0300793 A1* | 12/2008 | Tilke ....................... | E21B 43/30 702/13 |
| 2009/0076873 A1 | 3/2009 | Johnson et al. | |
| 2009/0107669 A1 | 4/2009 | Elphick et al. | |
| 2009/0157590 A1* | 6/2009 | Mijares ................... | E21B 43/00 706/61 |
| 2009/0166033 A1 | 7/2009 | Brouwer et al. | |
| 2010/0185427 A1 | 7/2010 | Tilke et al. | |
| 2010/0193182 A1 | 8/2010 | Levy | |
| 2011/0106723 A1 | 5/2011 | Chipley et al. | |
| 2011/0162848 A1* | 7/2011 | Duffy ..................... | G01V 11/00 166/305.1 |
| 2011/0168391 A1* | 7/2011 | Saleri ...................... | E21B 43/00 166/250.15 |
| 2011/0290479 A1 | 12/2011 | Izgec et al. | |

FOREIGN PATENT DOCUMENTS

| | | |
|---|---|---|
| CN | 1973110 | 5/2007 |
| WO | 2013052731 | 4/2013 |
| WO | 2013052735 | 4/2013 |

OTHER PUBLICATIONS

E. Idrobo, et-al., "Swept Volume Calculations and Ranking of Geostatistical Reservoir Models Using Streamline Simulation," SPE/AAPG Western Regional Meeting, Jan. 1, 2000, Society of Petroleum Engineers, 13 pages.*
H. Ates, et al., "Ranking and Upscaling of Geostatistical Reservoir Models Using Streamline Simulation: A Field Case Study." SPE Reservoir Evaluation & Engineering, vol. 8, No. 1, 2005, pp. 22-32.*
T. Friedel, et al., "Efficient Uncertainty Management Workflow for Brownfield Redevelopment," 2009 SPE/EAGE Reservoir Characterization and Simulation Conference, Oct. 19-21, 2009, 14 pages.*
C. Wang, et al., "Production Optimization in Closed-Loop reservoir management," 2009 SPE Annual Technical Conference and Exhibition, Nov. 11-14, 2007, pp. 506-523.*
International Search Report and Written Opinion dated Nov. 29, 2012 for International Application No. PCT/US12/58343. (15 pages).
International Preliminary Report on Patentability dated Nov. 27, 2013 for International Application No. PCT/US12/58843, (7 pages).
Australia Patent Examination Report No. 1 dated Apr. 21, 2015 for Australian Application No. 2012318521, (4 pages).
Response to Australia Patent Examination Report No. 1 dated Apr. 21, 2015 for Australian Application No. 2012313521, filed on Apr. 28, 2015, (17 pages).
Australia Patent Examination Report No. 2 dated Apr. 30, 2015 for Australian Application No. 2012318521, (5 pages).
Response to Australia Patent Examination No. 2, dated Apr. 30, 2015 for Australian Application No. 2012318521, filed on May 11, 2015, (10 pages).
Australia Patent Examination Report. No. 3 dated Jun. 2, 2015 for Australian Application No. 2012318521, (3 pages).
Response to Australia Patent Examination Report No. 3 dated Jun. 2, 2015 for Australian Application No. 2012318521, filed on Oct. 30, 2015, (1 page).
China Office Action dated Jun. 29, 2016 for Chinese Application No. 201280048232.3, (11 pages).
Response to China Office Action dated Jun. 29, 2016 for Chinese Application No. 201280048232.3 filed on Sep. 14, 2016, (6 pages), (Identified only by date bottom of p3 and Appl No.).
Canada Office Action dated Aug. 25, 2016 for Canadian Application No. 2850782, (8 pages).
Essen et al., "Hierarchical Long-Term and Short-Term Production Optimization." Society of Petroleum Engineers [online] Mar. 2011, vol. 16, No. 1, pp. 191-199, Abstract only, (1 page).
"Redrill Water Injection Well S-67A Approved", California State Lands Commission Meeting Minutes, retrieved from http://archives.slc.ca.gov/Meeting_Summaries/1970_Documents/02-26-70/items/022670C34.pdf, Feb. 26, 1970, 2 pages.
U.S. Appl. No. 14/002,496, Non-Final Office Action dated Sep. 12, 2014, 19 pages.
U.S. Appl. No. 14/015,420, Final Office Action dated Dec. 30, 2016, 38 pages.
U.S. Appl. No. 14/015,420, Non-Final Office Action dated Jun. 13, 2016, 35 pages.
Alarcon et al., "Global Optimization of Gas Allocation to a Group of Wells in Artificial Lift Using Nonlinear Constrained Programming", Journal of Energy Resources Technology 124(4), 2002, pp. 262-268.
Australian Patent Application No. 2012318527, First Examination Report dated Jun. 12, 2014, 3 pages.
Australian Patent Application No. 2012318531, First Examination Report dated Apr. 15, 2015, 4 pages.
Australian Patent Application No. 2015218424, First Examiner Report dated Aug. 19, 2016, 4 pages.
Canadian Patent Application No. 2,850,501, Office Action dated Jan. 11, 2016, 4 pages.
Canadian Patent Application No. 2,850,501, Office Action dated Jun. 18, 2015, 4 pages.
Canadian Patent Application No. 2,852,953, Office Action dated Jan. 11, 2017, 4 pages.
Canadian Patent Application No. 2852953, Office Action dated Jan. 18, 2016, 4 pages.
Canadian Patent Application No. 2852953, Office Action dated Jun. 29, 2015, 4 pages.
Chinese Patent Application No. 201280048149.6, Office Action dated Apr. 29, 2016, 23 pages (includes 12 pages of English Translation).
Chinese Patent Application No. 201280048232.3, Office Action dated Nov. 4, 2015, 19 pages (8 pages of original text, 11 pages of translation).
European Patent Application No. 12838857.6, Extended Search Report dated Dec. 15, 2015, 8 pages.

(56) References Cited

OTHER PUBLICATIONS

European Patent Application No. 12838867.5, Extended Search Report dated Dec. 12, 2015, 8 pages.
European Patent Application No. 12839029.1, Extended Search Report dated Dec. 15, 2015, 9 pages.
Garcia et al., "Enhanced Reservoir Scenarios Management Worfklow", Society of Petroleum Engineers, SPE132983, Oct. 18, 2010, pp. 1-15.
Izgec et al., "Optimizing Volumeric Sweet Efficiency in Waterfioods by Integrating Streamlines, Design of Experiments, and Hydrocarbon F-☐ Curves", presented at the Western North America Regional Meeting, Anaheim, CA (SPE 132609), May 26-30, 1010, pp. 1-15.
International Patent Application No. PCT/US2012/058851, International Search Report and Written Opinion dated Dec. 11, 2012, 6 pages.
International Patent Application No. PCT/US2012/058858, International Search Report and Written Opinion dated Dec. 11, 2012, 7 pages.
Thiele et al., "Using Streamline-Derived Injection Efficiencies for Improved Waterflood Management", SPE Reservoir Evaluation and Engineering, vol. 9, No. 2, Apr. 2006, pp. 187-196.
Kuchuk et al., "The Future of Reservoir Management", Middle East & Asia Reservoir Review, No. 5, Schlumberger, Jul. 18, 2018, pp. 52-67.

* cited by examiner

SYSTEMS AND METHODS FOR SUBSURFACE OIL RECOVERY OPTIMIZATION

CROSS-REFERENCE TO RELATED APPLICATIONS

This Application claims priority from PCT Patent Application No. PCT/US2012/058843, filed on Oct. 5, 2012, which claims priority from U.S. Provisional Patent Application Ser. No. 61/544,202, filed on Oct. 6, 2011, which are incorporated herein by reference.

STATEMENT REGARDING FEDERALLY SPONSORED RESEARCH

Not applicable.

FIELD OF THE INVENTION

The present invention generally relates to systems and methods for subsurface oil recovery optimization. More particularly, the invention relates to subsurface secondary and/or tertiary oil recovery optimization based on either short term, medium term or long term optimization analysis of selected zones, wells patterns/clusters and/or fields.

BACKGROUND OF THE INVENTION

Various systems and methods are well known for maximizing subsurface secondary and/or tertiary oil recovery. Current systems for maximizing secondary and/or tertiary recovery generally rely on many steps, in different systems, and software tools, which users need to setup and manage by themselves. This is a manual process, where the user will create a numerical analysis model of the reservoir, run the model with a few different operating decisions and/or parameters, analyze the results and choose the best answer. The unautomated process often requires running multiple applications, which are not integrated, to obtain results to be integrated. As a result of the different applications required, a significant amount of reformatting data between applications may be necessary, creating further labor and the potential for error. Moreover, as the process is manually performed in numerous locations, there is no electronic audit trail for later review. This may be further complicated as analysis tools are generally generic and not designed to integrate data and to provide and assess simulations according to varying criteria. Current systems provide very little feedback as to the quality of the model and checking to make sure that the results are realistic. They do not provide interactive graphical feedback to the user at various levels of field operations and they do not provide true optimization and decision support tools. They also do not leverage the true value of real time data from the field. As a result, current systems are manual, labor intensive, and require transfer of data from one system to another while requiring the users to verify that the output from one system is usable as the input to another system. These deficiencies in current systems mean that the number of people who can do this type of work is quite limited. As a result, this process is performed by a limited number of experts within an organization. With a currently available set of tools, even these experts take a very long time to perform the process and are prone to errors because of the manual nature of the process.

As a result of the limitations of current systems, users generally do not look at multiple scenarios to take into account possible uncertainties in the underlying numerical reservoir model. Nor to users exhaustively utilize optimization technologies to analyze, rank and choose the best development operations to increase secondary and/or tertiary oil recovery. This often precludes users from addressing uncertainties in a reservoir model by periodically reassessing selected scenarios based on data such as historical performance of the reservoir, patterns, wells, and/or zones or other data. Moreover, in addition to all the limitations listed above, current systems do not provide good tools to allow a user to update a model, or series of models. These difficulties in generating a first model serve as a deterrent to generation of later updates.

Nor do current systems address the overall performance of the field or effectiveness of secondary or tertiary recovery processes. Practitioners of the current processes will generally recognize that sweep efficiency is an important metric of recovery process effectiveness. Sweep efficiency can be calculated at different locations in a field and at different scales. For example, sweep efficiency could be calculated locally near a well, at a zone level, between two wells, at a pattern level, at a field level and at different levels in between. Currently, there is no good method to measure or calculate sweep efficiency health indicators. There is also no integrated system and method for simultaneous simulation and optimization of well production at different scales or ranks from the field to equipment levels.

SUMMARY OF THE INVENTION

The present invention therefore, meets the above needs and overcomes one or more deficiencies in the prior art by providing systems and methods for subsurface secondary and/or tertiary oil recovery optimization based on either short term, medium term or long term optimization analysis of selected zones, wells patterns/clusters and/or fields.

In one embodiment, the present invention includes a method for short term oil recovery optimization, which comprises: i) selecting one or more zones, wells, patterns/clusters or fields; ii) displaying multiple optimization scenarios and corresponding actions for optimization of the one or more selected zones, wells, patterns/clusters or fields; iii) selecting one or more of the optimization scenarios and displaying each corresponding action; iv) selecting a prediction date for each selected optimization scenario; and v) displaying the one or more selected optimization scenarios and the effect of each corresponding action on the one or more selected zones, wells, patterns/clusters or fields on the prediction date using a computer system.

In another embodiment, the present invention includes a program carrier device for carrying computer executable instructions for short term oil recovery optimization. The instructions are executable to implement: i) selecting one or more zones, wells, patterns/clusters or fields; ii) displaying multiple optimization scenarios and corresponding actions for optimization of the one or more selected zones, wells, patterns/clusters or fields; iii) selecting one or more of the optimization scenarios and displaying each corresponding action; iv) selecting a prediction date for each selected optimization scenario; and v) displaying the one or more selected optimization scenarios and the effect of each corresponding action on the one or more selected zones, wells, patterns/clusters or fields on the prediction date.

Additional aspects, advantages and embodiments of the invention will become apparent to those skilled in the art from the following description of the various embodiments and related drawings.

BRIEF DESCRIPTION OF THE DRAWINGS

The present invention is described below with references to the accompanying drawings in which like elements are referenced with like reference numerals, and in which.

DETAILED DESCRIPTION OF THE PREFERRED EMBODIMENTS

Figure 1:
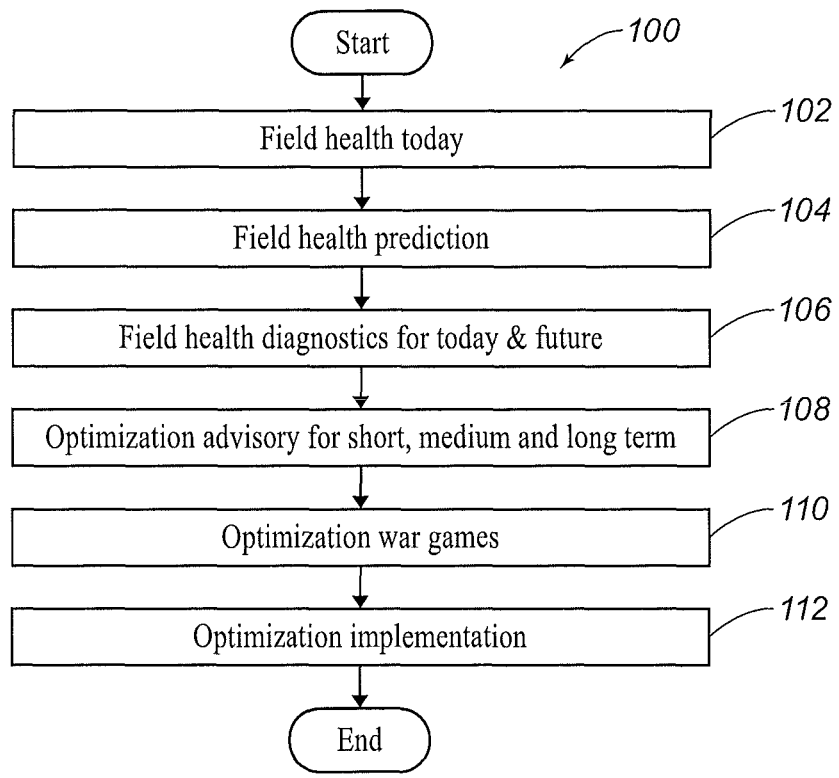
FIG. 1 illustrates an overall process for subsurface oil recovery optimization according to the present invention.

The subject matter of the present invention is described with specificity, however, the description itself is not intended to limit the scope of the invention. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied in other industries to achieve similar results.

The present invention includes systems and methods for optimizing oil recovery, by reducing unwanted fluid/gas production, reducing workover downtime, reducing by-passed oil and gas, and maximizing net present value through optimization of injection and production profiles. The systems and methods therefore, consider intelligent manipulation of subsurface displacement profiles; surface and facility optimization constraints, well intervention/re-completion designs, and dynamic field development planning through decisions to drill and design new producer/injector/observation wells.

The systems and methods perform all permutations and combinations with surveillance, diagnostics and optimization from a micro to a macro scale spanning from the equipment level to the zone level, to well level to a pattern/cluster level to, finally, the reservoir/field level. The systems and methods allow the user to perform present and/or predictive diagnostics on the field and/or sweep efficiency health, as well as advise the user of optimum optimization actions for short, medium and long term time frames. The systems and methods allow the user to interactively perform comparative "what if" scenarios (war games) with the previously advised optimization actions, generate appropriate business cases and thus, take and implement the appropriate optimization actions that help maximize oil recovery and economic value.

The systems and methods utilize real-time surveillance field data to provide advanced value of integrated asset management, which provides an automated advisory for short, medium and/or long term multiple-well/pattern and field level optimization. The systems and methods allow personnel to perform predictive analysis on the effect of selected optimization actions, and deliver an intuitive user interface for enhanced collaborative decision making between asset, reservoir, operations, and production personnel. The systems and methods, therefore, obviate the need for labor intensive simulation and optimization in separate actions.

In short, the systems and methods enable monitoring of the subsurface health of a production field and provide automated advisory on proactive reservoir diagnostics with tangible optimization actions, thus permitting forecasted analysis on the proposed reservoir optimization actions.

Method Description

Referring now to FIG. 1, an overall process 100 for subsurface oil recovery according to the present invention is illustrated.

In step 102, the process 100 identifies present field health. One embodiment of a method for identifying field health today is illustrated by step 202 in FIG. 2.

In step 104, the process 100 predicts field health. One embodiment of a method for field health prediction is illustrated by steps 204-208 in FIG. 2.

In step 106, the process 100 diagnoses field health for today and the future, which may include identifying and detecting the bypassed and unswept oil spots using a mobile water saturation function. One embodiment of a method for diagnosing field health for today and the future is illustrated by step 210 in FIG. 2.

In step 108, the process 100 advises optimization for short, medium, and long terms, if optimization is desired. One embodiment of a method for determining the desired optimization is illustrated by steps 212, 214, 218, and 222 in FIG. 2.

If optimization is desired, then the user must also select whether the time-frame for optimization will be short term, medium term, or long term. If short term optimization is desired, then one embodiment of a method for short term optimization is illustrated by steps 302-306 in FIG. 3. If medium term optimization is desired, then one embodiment of a method for medium term optimization is illustrated by steps 402-406 in FIG. 4. If long term optimization is desired, then one embodiment of a method for long term optimization is illustrated by steps 502-506 in FIG. 5.

Optimization may be provided as an automated advisory for reactive and proactive optimization of sweep efficiency to achieve key performance targets—including time horizons (from 1 day to any number of years), reducing water handling (as a percentage), reducing downtime for workover times (as a percentage), reducing by-passed oil, and increasing recovery from new wells and recompletions (as a percentage). Optimization may also enable timely decisions based on real-time data to provide updated, predictive models and provide expert system and optimized advisories.

In step 110, the process 100 includes "what if" scenarios to assess and compare various optimization scenarios, which may also be regarded as optimization war games. One embodiment of a method for conducting optimization "what if" scenarios is illustrated by steps 308-316 in FIG. 3 for short term optimization, steps 408-416 in FIG. 4 for medium term optimization, and steps 508-516 in FIG. 5 for long term optimization.

In step 112, the process 110 implements the optimization. One embodiment of a method for obtaining or seeking optimization implementation is illustrated by steps 318-326 in FIG. 3 for short term optimization, steps 418-426 in FIG. 4 for medium term optimization, and steps 518-526 in FIG. 5 for long term optimization.

The overall process 100 therefore, provides a fully integrated subsurface reservoir management solution for improving sweep efficiency and allowing reservoir and production personnel (likely engineers) to collaborate. This may be accomplished while monitoring reservoir dynamics during production, utilizing surface and downhole sensors, updating and simulating the reservoir and well models. This may provide control strategies for short-production optimization and increased recovery utilizing surface chokes, ICD's and smartwells while implementing optimization strategies on future planning, such as infill drilling to recover bypassed oil.

Figure 15:
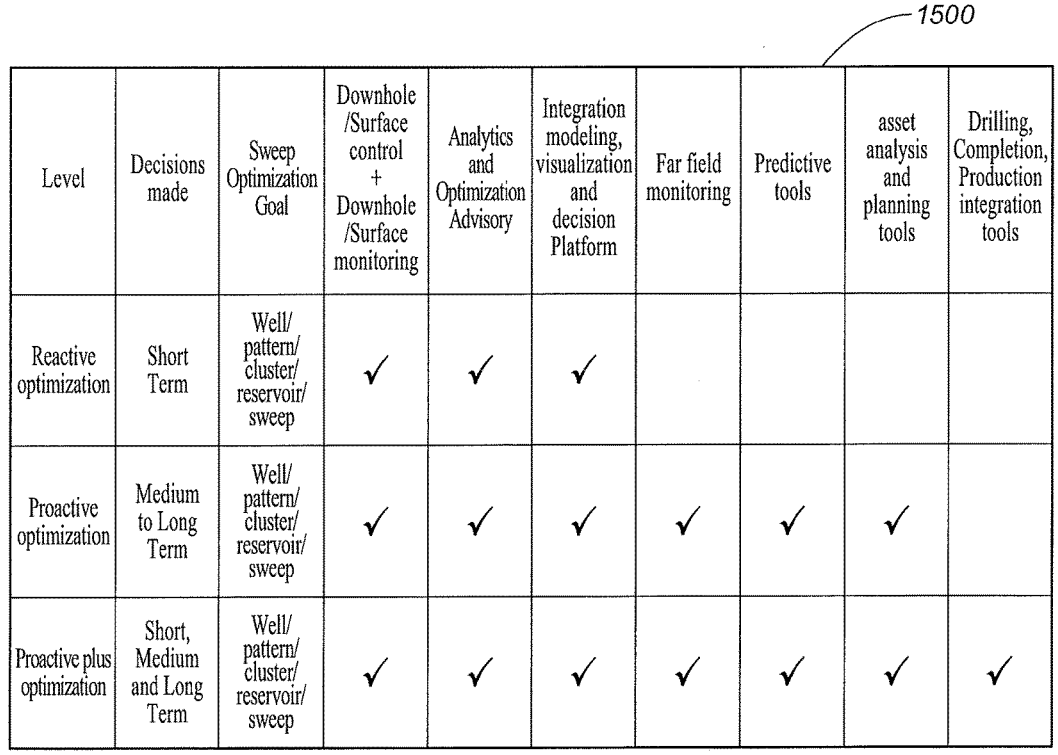
FIG. 15 is a table illustrating exemplary levels of optimization provided by the present invention.

The process 100 for optimization may be reactive, simple proactive, or enhanced proactive ("proactive plus"). Reactive optimization may be characterized as an immediate reaction to current conditions. Reactive optimization may occur in the short term and may be directed to actions such as optimizing choke settings and production/injection rates. Simple proactive optimization may be characterized as an action based on predicted conditions, such as to predict fluid movement away from the wellbore and therefore, to optimize subsurface operations by taking measures such as choking a downhole valve setting in order to increase total recovery. Simple proactive optimization also focuses on long term field development planning optimization such as scheduling future infill drilling producer/injector locations, workovers, their configurations, etc. Enhanced proactive optimization, on the other hand, provides for right time integration of exploration, drilling, completion and production disciplines while evaluating the appropriate plan of action for developing a field to ensure there is sufficient time after optimization options are identified that might effect them. Simple proactive optimization may occur over the medium term to long term (such as, but not limited to, three months to 2 years) and include the actions of reactive optimization together with short term to medium term field development plan updates. Thus, integration involves running several reservoir depletion scenarios as well as cost/benefit analysis scenarios, in real time, thus helping plan the best integrated solution across all disciplines of an asset development life cycle. Enhanced proactive optimization for example, could allow the operator to change completion and production planning in real time for better ultimate depletion, while actually drilling and gathering additional information about the reservoir. The goals of each of these exemplary levels of optimization are illustrated by the table 1500 in FIG. 15.

Thus, the process 100 depends on right time reservoir management including continuous reservoir visualization, proactive reservoir diagnostics and optimization, and predictive reservoir optimization analysis.

Figure 2:
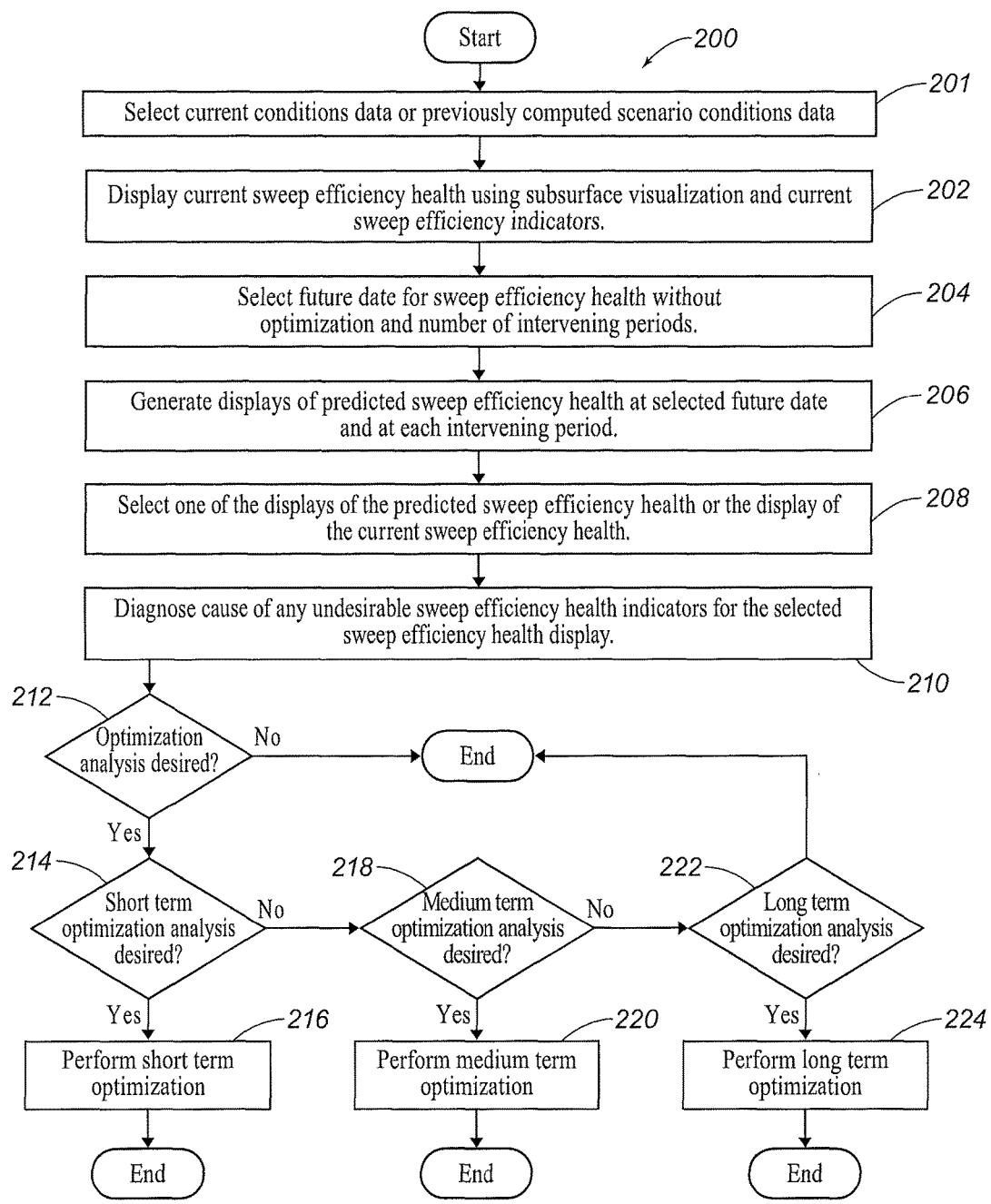
FIG. 2 is a flow diagram illustrating one embodiment of a method for implementing the present invention.

Referring now to FIG. 2, a flow diagram illustrates one embodiment of a method 200 for implementing the present invention.

Figure 6:
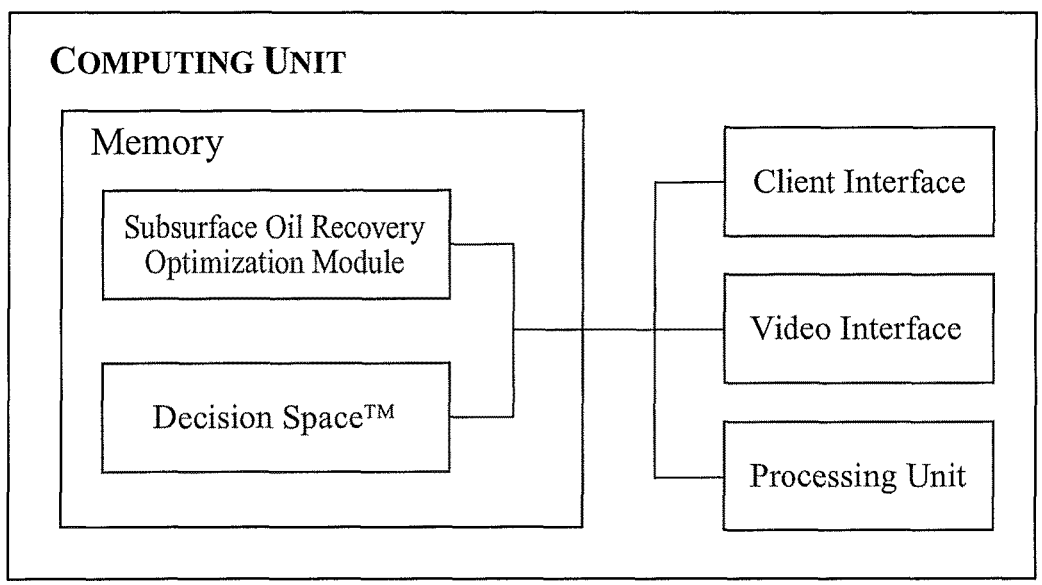
FIG. 6 is a block diagram illustrating one embodiment of a system for implementing the present invention.

In step 201, current conditions data or previously computed scenario conditions data are selected using the client interface and/or the video interface described in reference to FIG. 6. Selection of whether to use current conditions data or previously computed scenario conditions data may be based on a subjective determination of whether to use current conditions or previous optimizations. Current conditions data provides the ability to assess the present health of the field and to perform optimizations based on that data. Previously computed scenario conditions data provides the ability to review the past health of the field in relation to current health and to perform optimizations based on saved data, which may include optimized short, medium or even long term data.

In step 202, the current sweep efficiency health is displayed using techniques well known in the art and the video interface described in reference to FIG. 6. Subsurface visualization techniques and current sweep efficiency health indicators, for example, may be used with integrated current conditions data, previously computed scenario conditions data and historic data to provide a display of ranked zones, wells, patterns/sectors and/or fields representing the current sweep efficiency health. Effective subsurface visualization requires visualization of the reservoir dynamics as the subsurface changes in the wellbore, near the wellbore and away from the wellbore. A goal of subsurface visualization is to create a very high resolution three dimensional (3-D) visualization interface, which may include various features including fiber optic monitoring visualization, surface deformation visualization, 3D fluid displacement visualization, bypassed oil 3D visualization, oil/water interface visualization, streamlines visualization, field/zone/well maps, isobaric maps, saturation maps, injection patterns at subsurface zone-levels, and zone level allocations of production/injection.

In step 204, a future date for the prediction of sweep efficiency health without optimization and the number of intervening periods are selected using the client interface and/or the video interface described in reference to FIG. 6. Selection of the future date and intervening periods is subjective and is based on the preference and/or experience of the user. One example of a future date selected for the prediction of sweep efficiency health without optimization and the number of intervening periods is illustrated by the graphical user interface 700 in FIG. 7, which illustrates a future date four (4) years in the future and intervening periods of one year.

Figure 7:
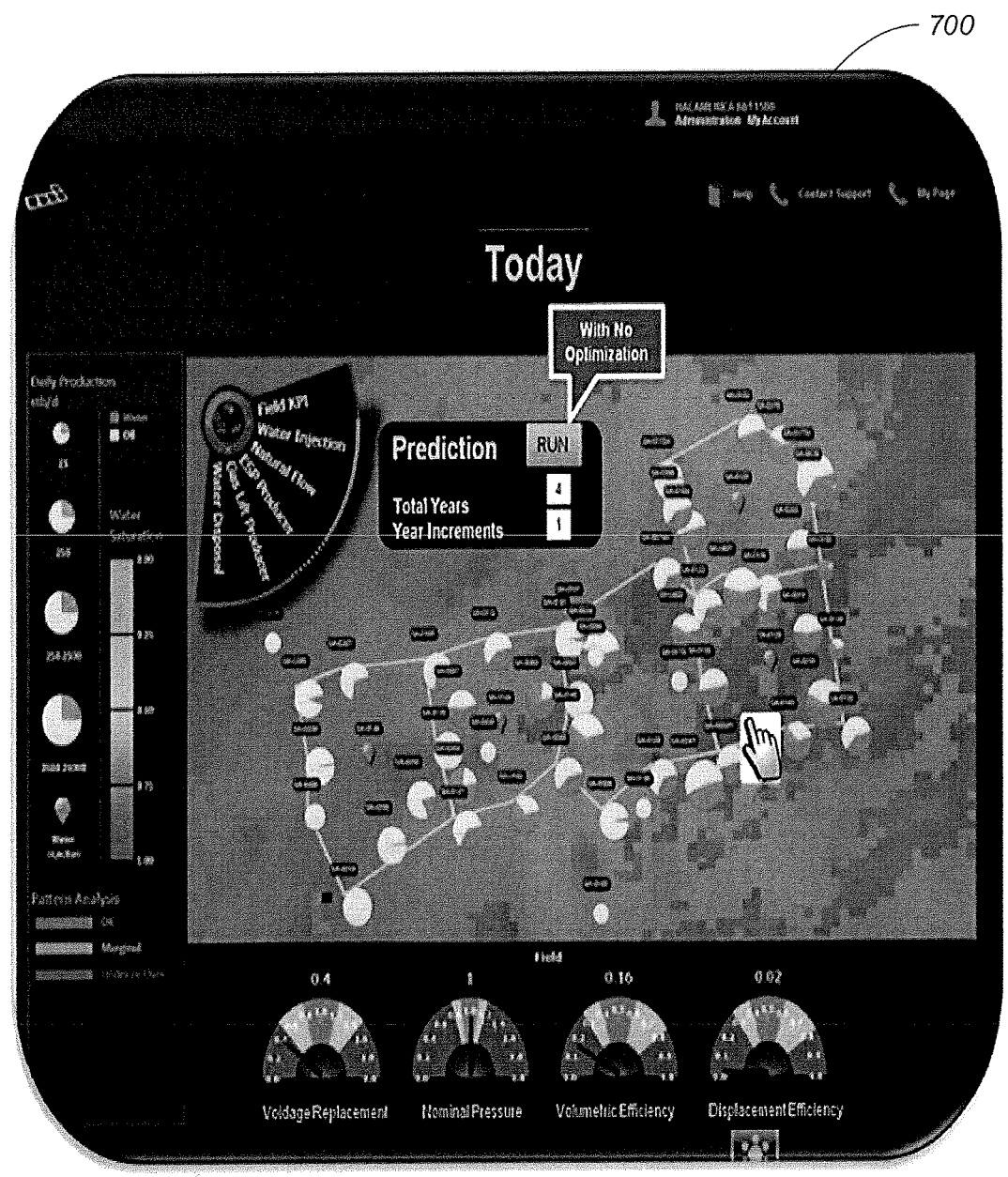
FIG. 7 is an exemplary graphical user interface illustrating step 204 in FIG. 2.
Figure 8:
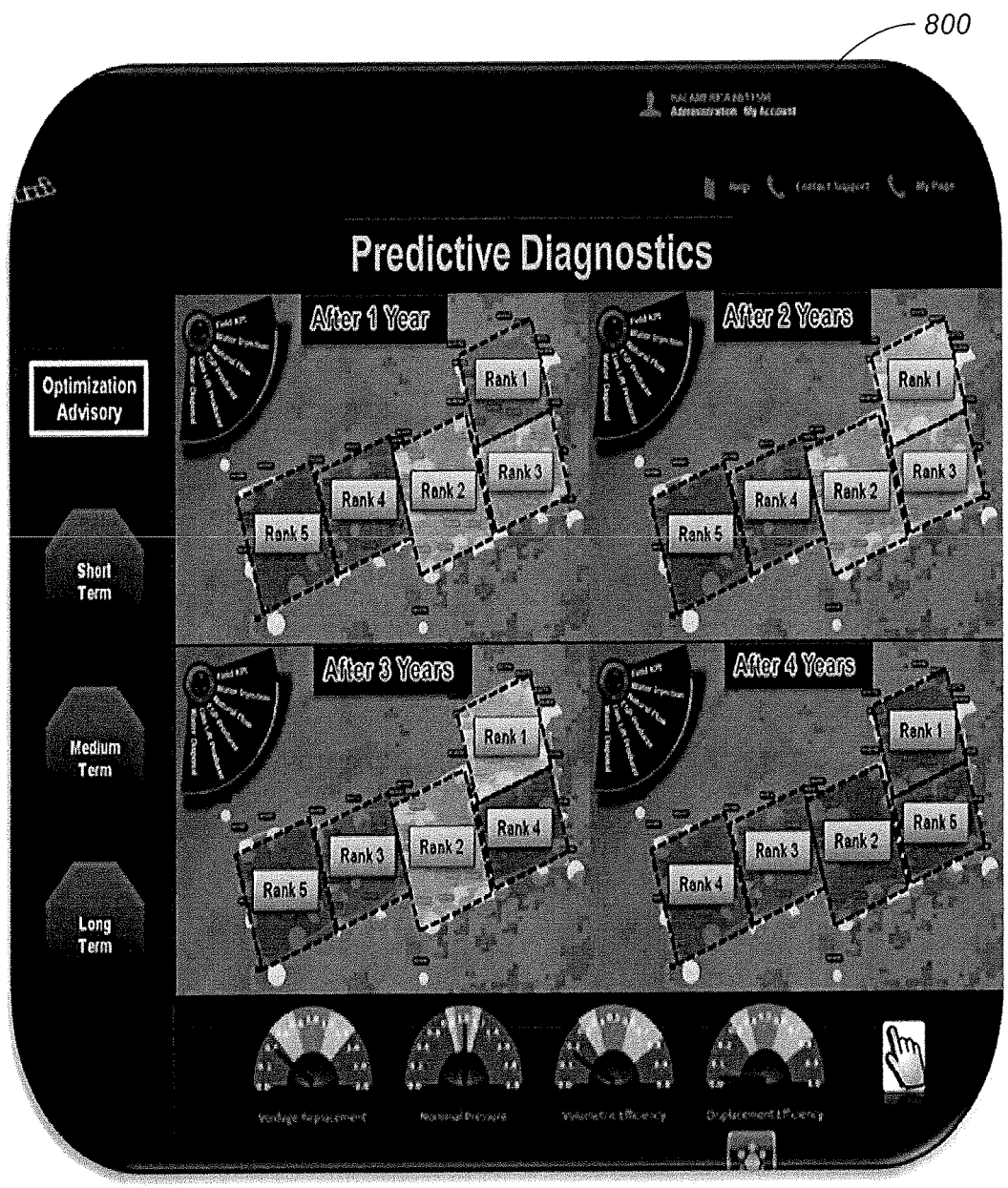
FIG. 8 is an exemplary graphical user interface illustrating step 206 in FIG. 2.

In step 206, displays of the predicted sweep efficiency health at the selected future date and at the end of each of the intervening periods are generated using techniques well known in the art and the video interface described in reference to FIG. 6. The displays include a rank of the sweep efficiency health for the identified zones, wells, patterns/sectors and/or fields as well as other potential user-defined spatial scales. One example of a display of the predicted sweep efficiency health at a selected future date and at the end of each intervening period selected for FIG. 7 is illustrated by the graphical user interface 800 in FIG. 8.

In step 208, one of the displays of the predicted sweep efficiency health or the display of the current sweep efficiency health is selected using the client interface and/or the video interface described in reference to FIG. 6. Each selected display may provide further detail, including the history for sweep efficiency health indicators at any scale of the zone, well, pattern/sector and/or field.

In step 210, the cause of any undesirable sweep efficiency health indicators for the selected sweep efficiency health display is diagnosed using well known diagnostic techniques, such as those found in the DECISIONSPACE software for reservoir simulation. The cause may be displayed by an automated advisory feature that utilizes indicators including volumetric efficiency, voidage replacement, displacement efficiency, nominal pressure and wellbore capture factor (Fcap) layer by layer in the reservoir. The cause can also be diagnosed by comparing current conditions data with historic data or previously computed scenario conditions data. Various diagnostics can also be performed by evaluating a flow or production index that is normalized by a length of the perforating interval. A streamline numerical calculation can also be used to estimate correlation factors and well allocation factors.

In step 212, the method 200 determines whether optimization analysis of production is desired based on the results of step 210. If optimization analysis is desired, then the method 200 proceeds to step 214. Alternatively, the method 200 may proceed to steps 218 or 222 if optimization analysis is desired. Optimization analysis may be desired, for example, if the cause of any undesirable sweep efficiency health indicators is identified by the diagnostic performed in step 210. Otherwise, optimization analysis may not be desired if there are no undesirable sweep efficiency health indicators. If optimization analysis is not desired, then the method 200 ends.

In step 214, the method 200 determines if short term optimization analysis is desired based on the results of step 210 and whether the cause of any undesirable sweep efficiency health indicators can be immediately resolved (e.g. by adjusting a choke). If short term optimization analysis is not desired, then the method 200 proceeds to step 218. Alternatively, the method 200 may proceed to step 222 if short term optimization analysis is not desired. If short term optimization analysis is desired, then the method 200 proceeds to step 216.

Figure 3:
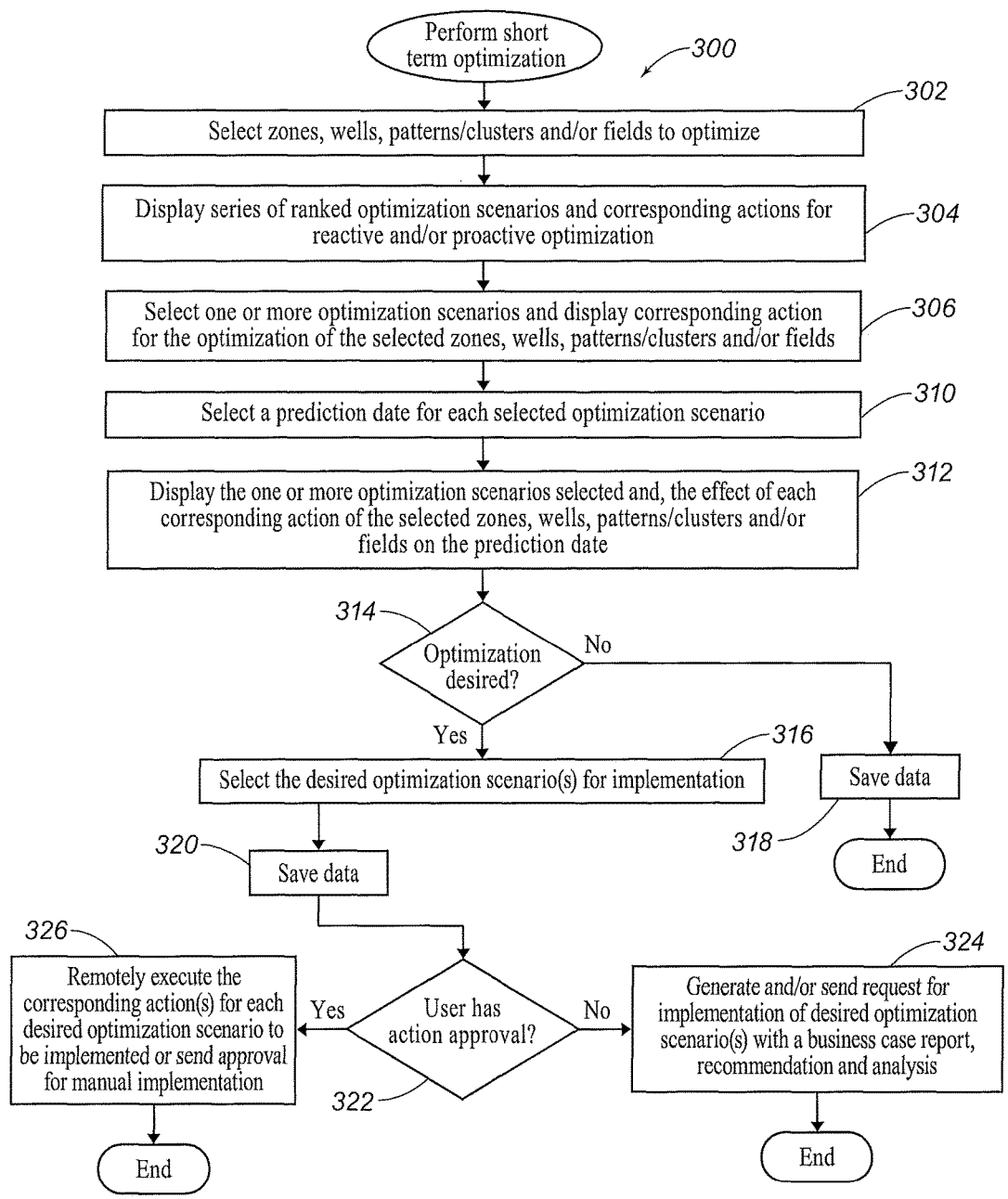
FIG. 3 is a flow diagram illustrating one embodiment of a method for performing step 216 in FIG. 2.

In step 216, short term optimization is performed. One embodiment of a method for performing short term optimization is illustrated in FIG. 3.

In step 218, the method 200 determines if medium term optimization analysis is desired based on the results of step 210 and whether the cause of any undesirable sweep efficiency health indicators cannot be resolved immediately but may be resolved within a matter of a day up to a few months (e.g. equipment repair). If medium term optimization analysis is not desired, then the method 200 proceeds to step 222. Alternatively, the method 200 may proceed to step 214 if medium term optimization analysis is not desired. If medium term optimization analysis is desired, then the method 200 proceeds to step 220.

Figure 4:
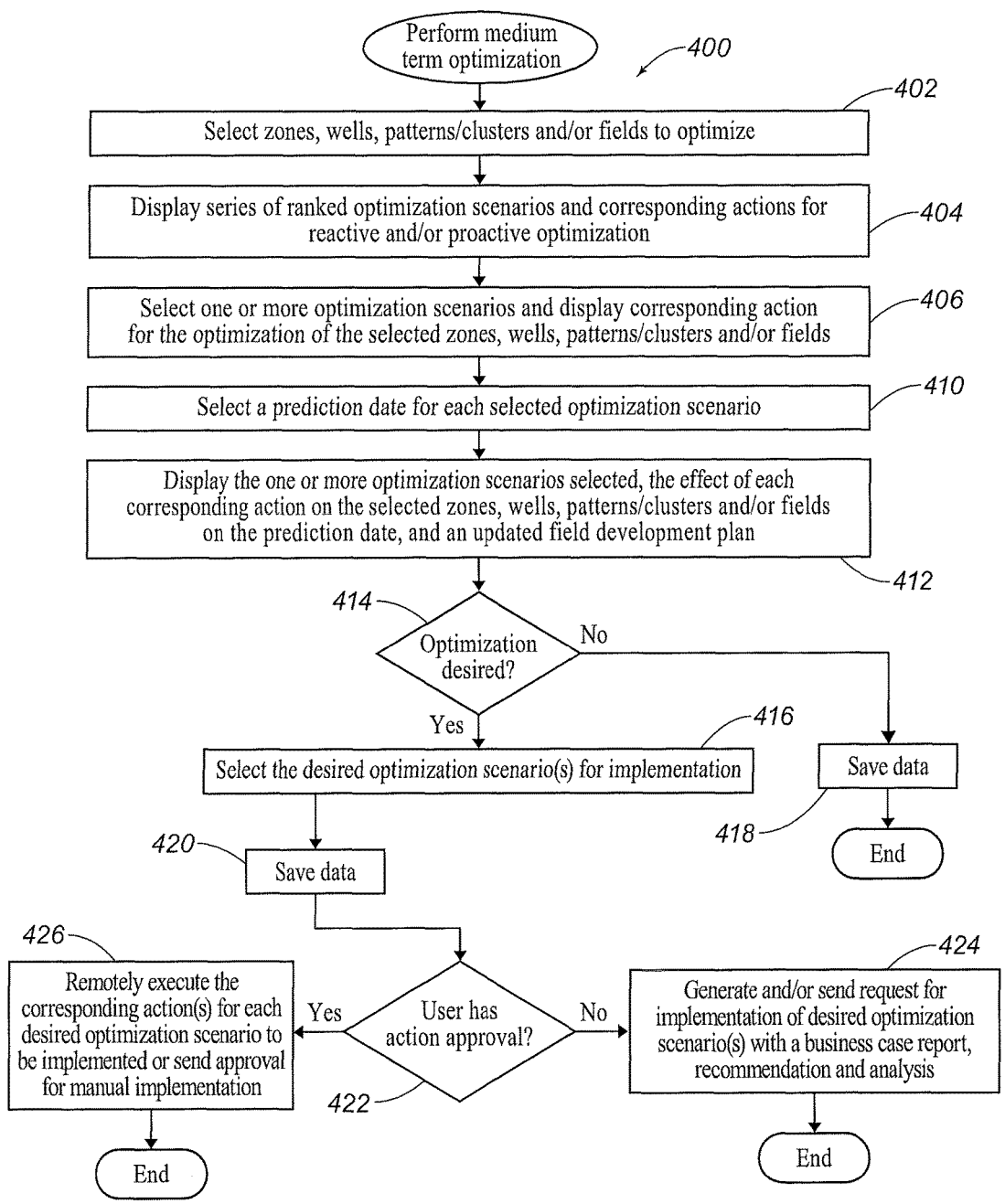
FIG. 4 is a flow diagram illustrating one embodiment of a method for performing step 220 in FIG. 2.

In step 220, medium term optimization is performed. One embodiment of a method for performing medium term optimization is illustrated in FIG. 4.

In step 222, the method 200 determines if long term optimization analysis is desired based on the results of step 210 and whether the cause of any undesirable sweep efficiency health indicators cannot be resolved immediately or in a few months but may be resolved within a year or longer (e.g. drilling new wells). The decision between performing short term optimization analysis, medium term optimization analysis or long term optimization analysis is subjectively based on the experiences and expertise of the person making the decision. If long term optimization analysis is not desired, then the method 200 ends. Alternatively, the method 200 may proceed to step 214 or step 218 if long term optimization analysis is not desired. If long term optimization analysis is desired, then the method 200 proceeds to step 224.

Figure 5:
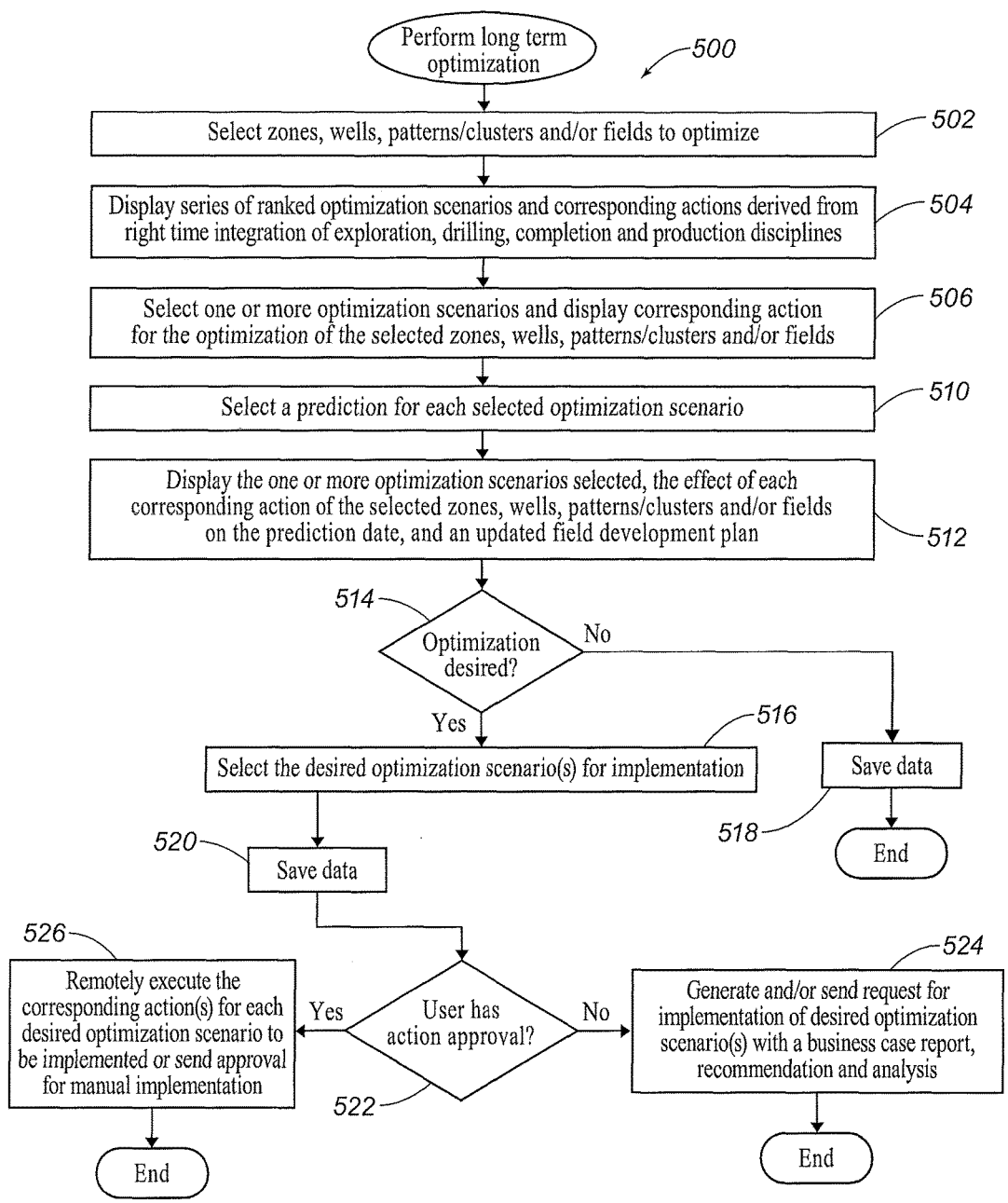
FIG. 5 is a flow diagram illustrating one embodiment of a method for performing step 224 in FIG. 2.

In step 224, long term optimization is performed. One embodiment of a method for performing long term optimization is illustrated in FIG. 5.

Referring now to FIG. 3, a flow diagram illustrates one embodiment of a method 300 for performing step 216 in FIG. 2.

In step 302, all zones, wells, patterns/clusters and/or fields to be optimized are selected from the selected sweep efficiency health display using the client interface and/or the video interface described in reference to FIG. 6.

In step 304, a series of ranked optimization scenarios and corresponding actions for reactive optimization are displayed using the video interface described in reference to FIG. 6 and techniques well known in the art. The series of ranked optimization scenarios and corresponding actions for reactive optimization are based on the optimization of the selected zones, wells, patterns, clusters and/or fields, which may be exported to a net present value calculator. Thousands of optimization scenarios can be created by reservoir simulation or utilizing proxy models.

Figure 9:
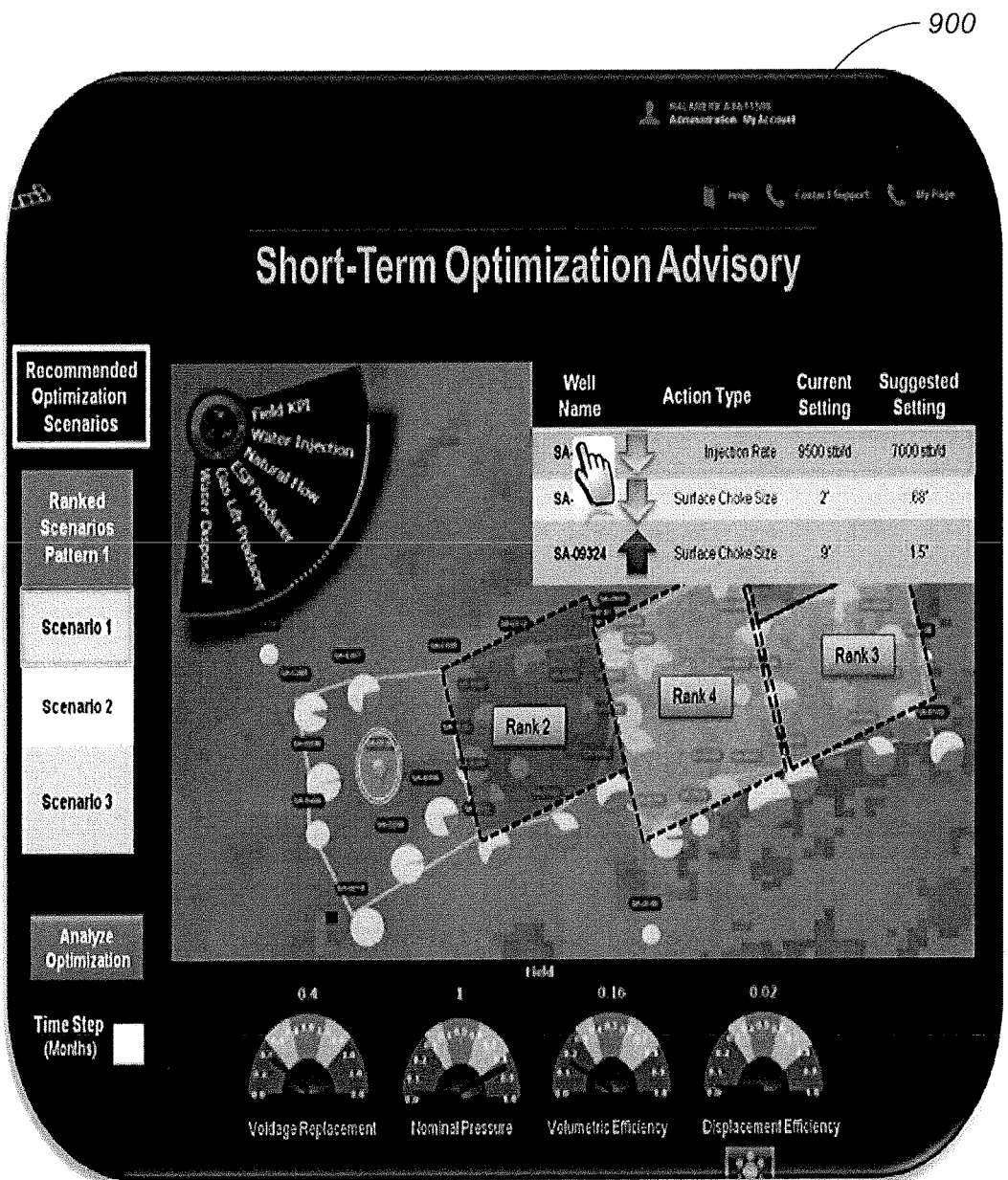
FIG. 9 is an exemplary graphical user interface illustrating step 306 in FIG. 3.

In step 306, one or more optimization scenarios may be selected and the corresponding action for the optimization of the selected zones, wells, patterns/clusters and/or fields is displayed using the client interface and/or the video interface described in reference to FIG. 6. One example of a display of the corresponding action is illustrated by the graphical user interface 900 in FIG. 9.

In step 310, a prediction date for each selected optimization scenario may be selected using the client interface and/or the video interface described in reference to FIG. 6. The prediction date determines the period of time each respective selected optimization scenario is run on a simulator.

In step 312, the one or more selected optimization scenarios and the effect of each corresponding action on the selected zones, wells, patterns/clusters and/or fields on the prediction date is displayed using the video interface described in reference to FIG. 6. The display may include, for example, changes in sweep efficiency health indicators, various subsurface visualization parameters for the selected zones, wells, patterns/clusters and/or fields, and various net present value derivatives for each selected optimization scenario.

In step 314, the method 300 determines whether optimization is desired based on the results of step 312. If optimization is desired, then the method 300 proceeds to step 316. If optimization is not desired, then the method 300 proceeds to step 318.

In step 316, the desired optimization scenario(s) may be selected from the one or more selected optimization scenarios for implementation using the client interface and/or the video interface described in reference to FIG. 6.

In step 318, the data underlying the results of step 312 is saved.

In step 320, the data underlying the results of step 312 selected in step 316 for implementation is saved.

In step 322, the method 300 determines whether the user has action approval to unilaterally implement the desired optimization scenario(s). If the user does not have the action approval, then the method 300 proceeds to step 324. If the user has action approval, then the method 300 proceeds to step 326.

Figure 10:
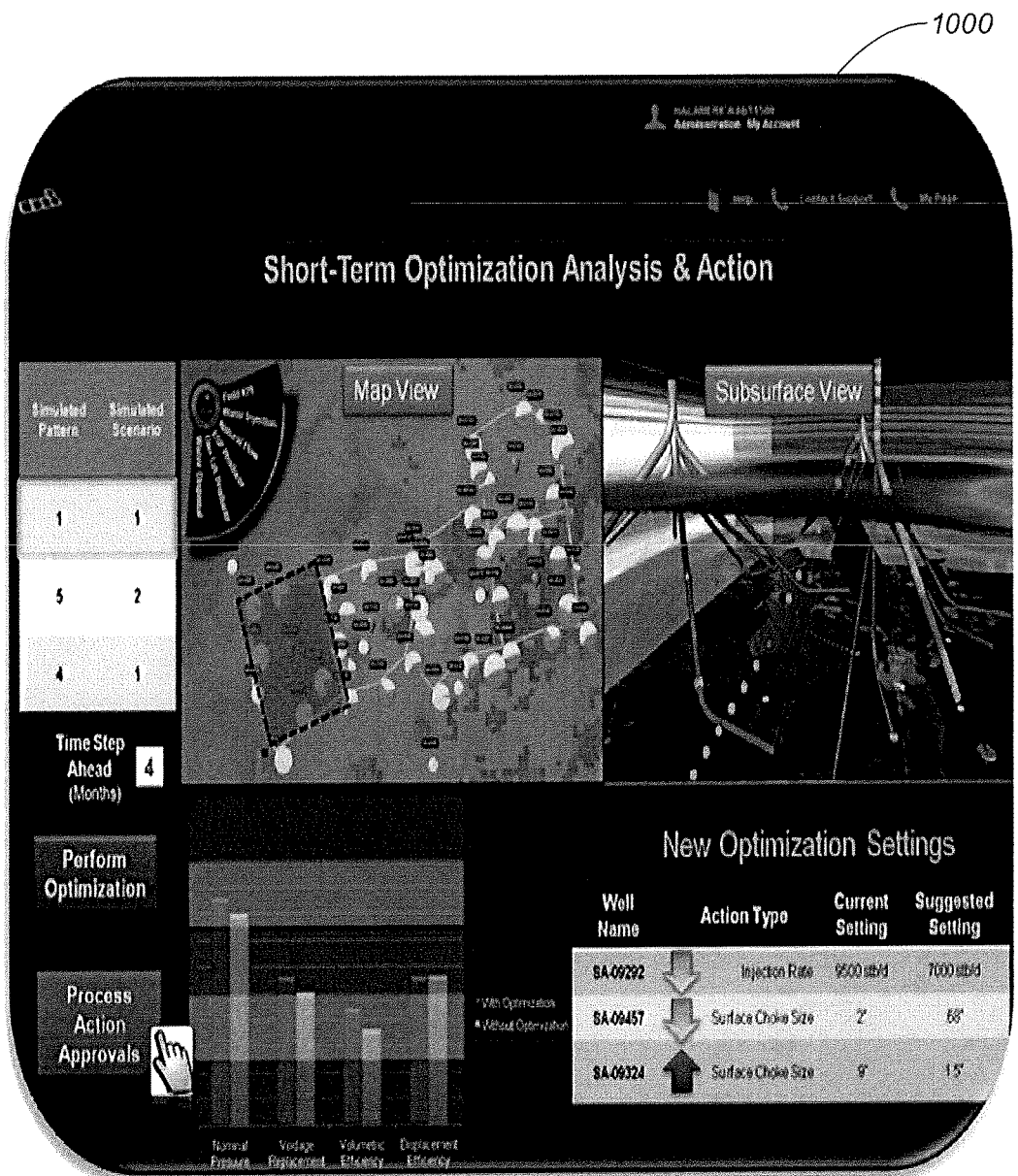
FIG. 10 is an exemplary graphical user interface illustrating step 324 in FIG. 3.

In step 324, a request for implementation of the desired optimization scenario(s) may be generated and/or sent with a business case report, recommendation and analysis using the client interface and/or the video interface described in reference to FIG. 6. One example of a request for implementation of the desired application scenario(s) is illustrated by the graphical user interface 1000 in FIG. 10.

In step 326, the corresponding action(s) for each desired optimization scenario to be implemented may be remotely executed or approved for manual implementation using the client interface and/or the video interface described in reference to FIG. 6.

Referring now to FIG. 4, a flow diagram illustrates one embodiment of a method 400 for performing step 220 in FIG. 2.

In step 402, all zones, wells, patterns/clusters and/or fields to be optimized are selected from the selected sweep efficiency health display using the client interface and/or the video interface described in reference to FIG. 6.

In step 404, a series of ranked optimization scenarios and corresponding actions for proactive optimization are displayed using the video interface described in reference to FIG. 6 and techniques well known in the art. The series of ranked optimization scenarios and corresponding actions for proactive optimization are based on the optimization of the selected zones, wells, patterns, clusters and/or fields, which may be exported to a net present value calculator. The optimization actions could be actions such as workovers/recompletions, conformance, surface instrumentation and others.

Figure 11:
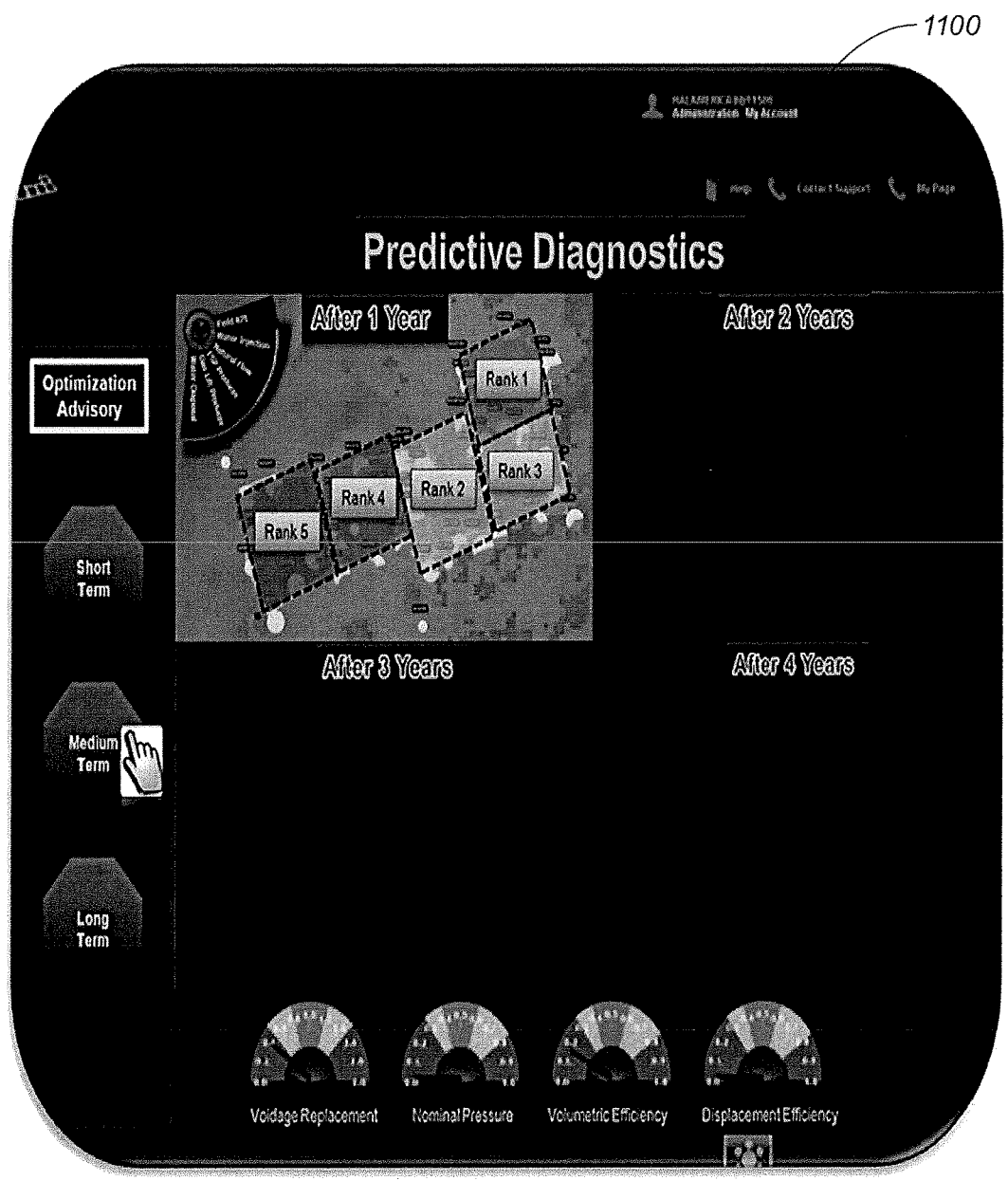
FIG. 11 is an exemplary graphical user interface illustrating step 406 in FIG. 4.

In step 406, one or more optimization scenarios may be selected and the corresponding action for the optimization of the selected zones, wells, patterns/clusters and/or fields is displayed using the client interface and/or the video interface described in reference to FIG. 6. One example of selecting one or more optimization scenarios is illustrated by the graphical user interface 1100 in FIG. 11.

In step 410, a prediction date for each selected optimization scenario may be selected using the client interface and/or the video interface described in reference to FIG. 6. The prediction date determines the period of time each respective selected optimization scenario is run on a simulator.

Figure 12:
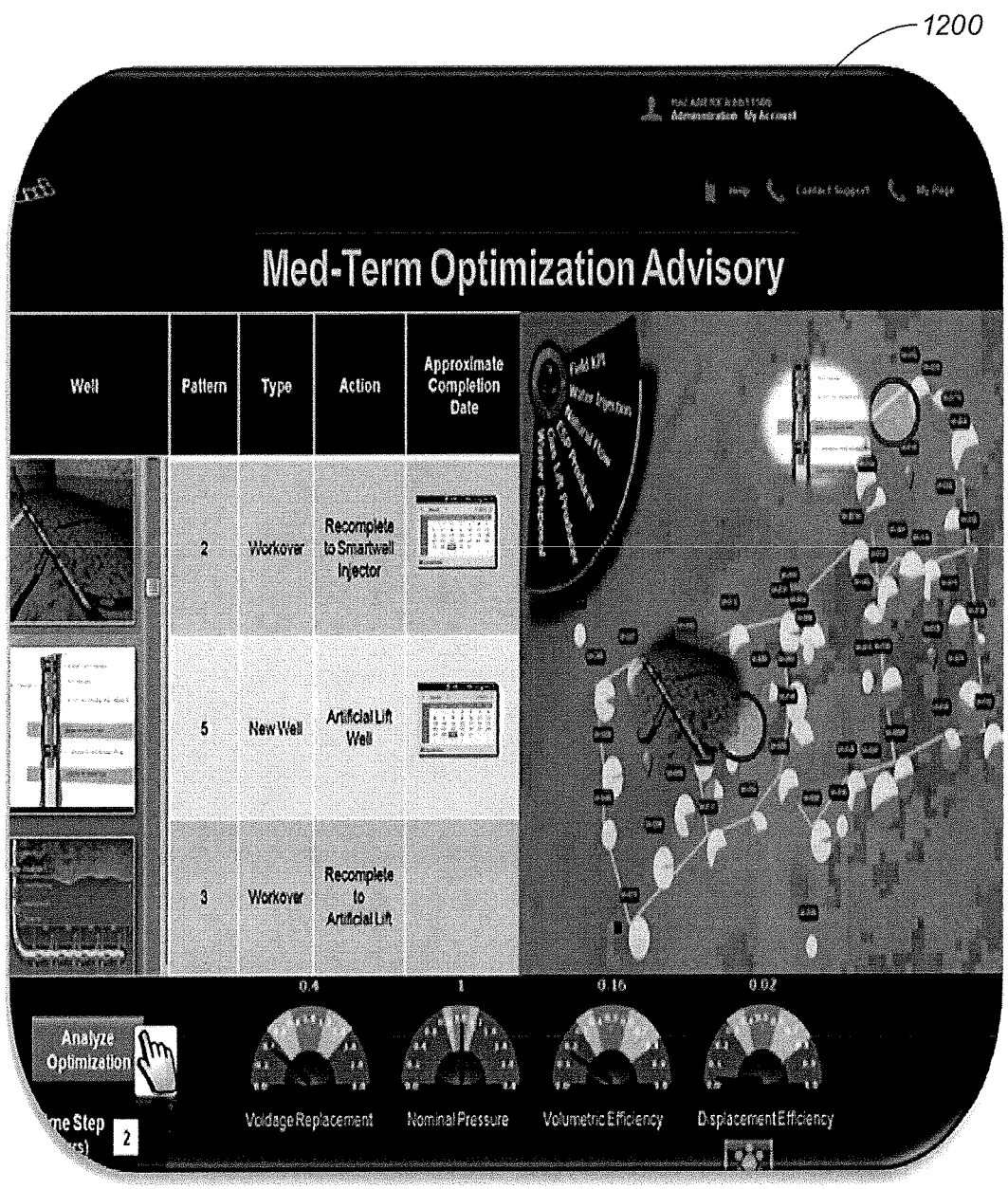
FIG. 12 is an exemplary graphical user interface illustrating step 412 in FIG. 4.
Figure 13:
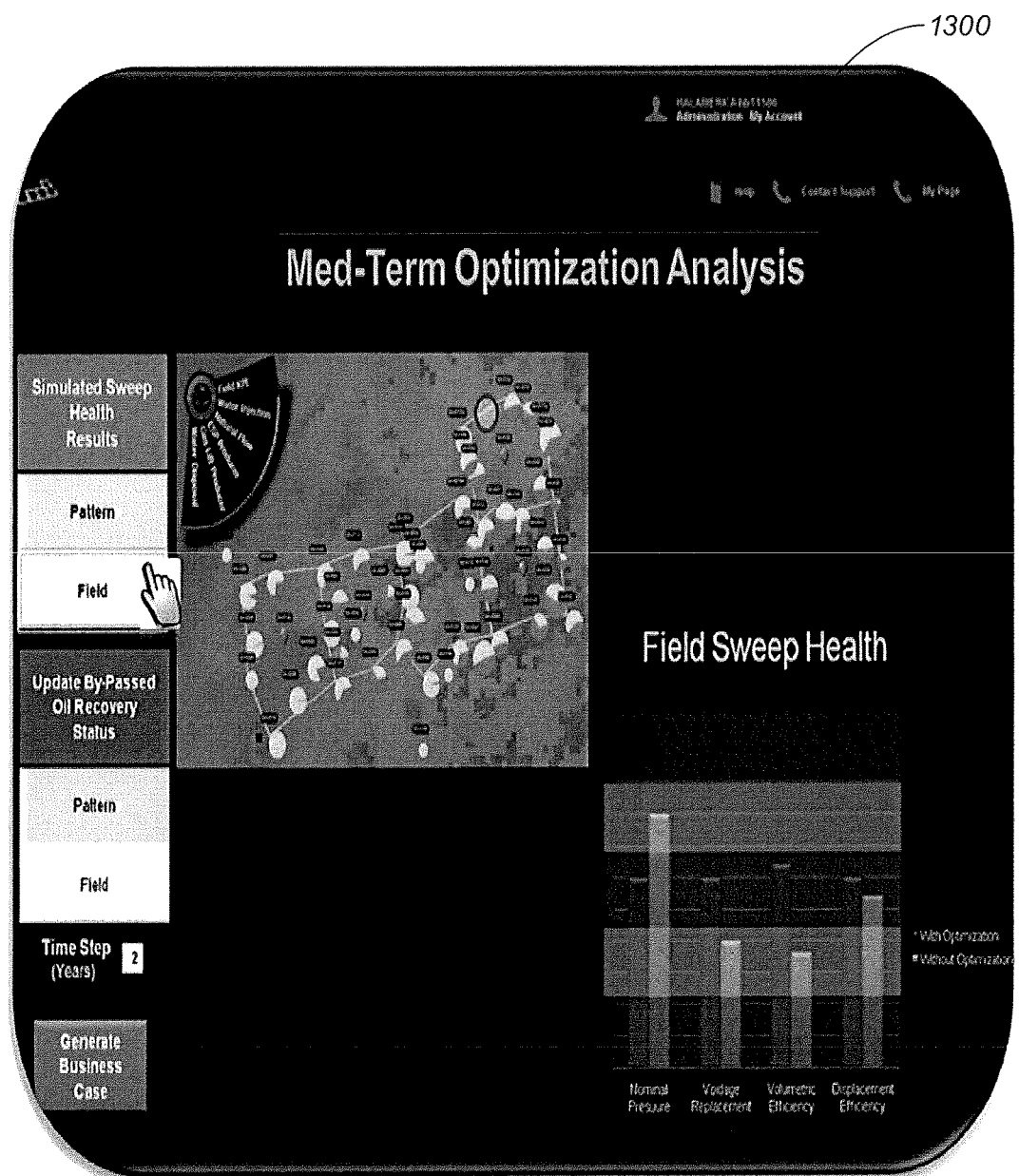
FIG. 13 is an alternative exemplary graphical user interface illustrating step 412 in FIG. 4.

In step 412, the one or more selected optimization scenarios, the effect of each corresponding action on the selected zones, wells, patterns/clusters and/or fields on the prediction date, and an updated field development plan for the field with the respective net present value calculation and projected production parameters are displayed using the video interface described in reference to FIG. 6. The display may include, for example, changes in sweep efficiency health indicators, various subsurface visualization parameters for the selected zones, wells, patterns/clusters and/or fields, and various net present value derivatives for each selected optimization scenario. One example of such a display is illustrated by the graphical user interface 1200 and 1300 in FIGS. 12 and 13, respectively.

In step 414, the method 400 determines whether optimization is desired based on the results of step 412. If optimization is desired, then the method 400 proceeds to step 416. If optimization is not desired, then the method 400 proceeds to step 418.

In step 416, the desired optimization scenario(s) may be selected from the one or more selected optimization scenarios for implementation using the client interface and/or the video interface described in reference to FIG. 6.

In step 418, the data underlying the results of step 412 is saved.

In step 420, the data underlying the results of step 412 selected in step 416 for implementation is saved.

Figure 14:
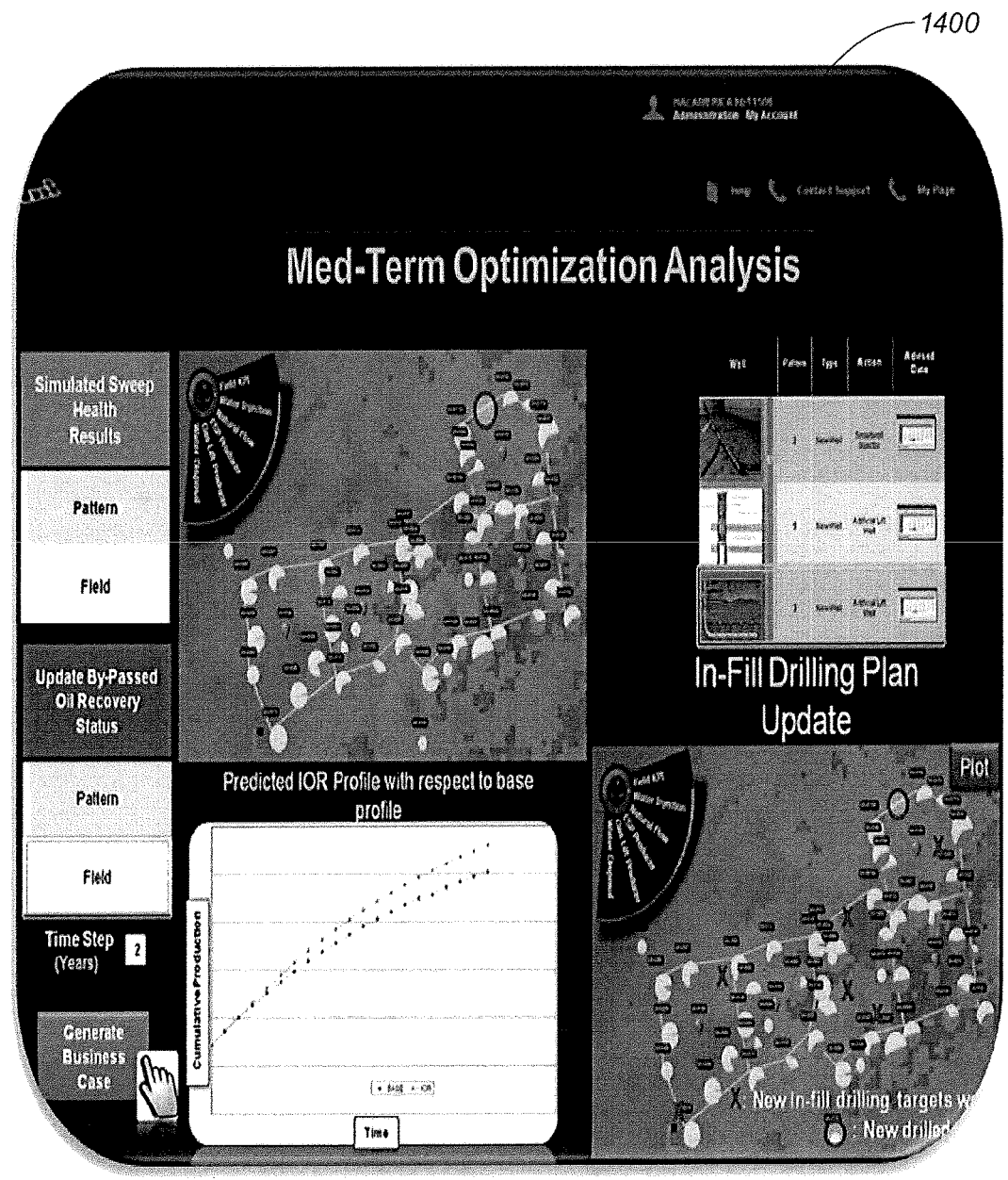
FIG. 14 is an exemplary graphical user interface illustrating step 422 in FIG. 4.

In step 422, the method 400 determines whether the user has action approval to unilaterally implement the desired optimization scenario(s). If the user does not have the action approval, then the method 400 proceeds to step 424. If the user has action approval, then the method 400 proceeds to step 426. One example of action approval to implement the desired optimization scenario(s) is illustrated by the graphical user interface 1400 in FIG. 14.

In step 424, a request for implementation of the desired optimization scenario(s) may be generated and/or sent with a business case report, recommendation and analysis using the client interface and/or the video interface described in reference to FIG. 6.

In step 426, the corresponding action(s) for each desired optimization scenario to be implemented may be remotely executed or approved for manual implementation using the client interface and/or the video interface described in reference to FIG. 6.

Referring now to FIG. 5, a flow diagram illustrates one embodiment of a method 500 for performing step 224 in FIG. 2.

In step 502, all zones, wells, patterns/clusters and/or fields to be optimized are selected from the selected sweep efficiency health display using the client interface and/or the video interface described in reference to FIG. 6.

In step 504, a series of ranked optimization scenarios and corresponding actions derived from right time (the desired future point in time—short, medium or long term) integration of exploration, drilling, completion and production disciplines for enhanced proactive (proactive plus) optimization are displayed using the video interface described in reference to FIG. 6 and techniques well known in the art while evaluating the appropriate plan of action for developing a field. The series of ranked optimization scenarios and corresponding actions for proactive plus optimization are based on the optimization of the selected zones, wells, patterns, clusters and/or fields, which may be exported to a net present value calculator.

In step 506, one or more optimization scenarios may be selected and the corresponding action for the optimization of the selected zones, wells, patterns/clusters and/or fields is displayed using the client interface and/or the video interface described in reference to FIG. 6.

In step 510, a prediction date for each selected optimization scenario may be selected using the client interface and/or the video interface described in reference to FIG. 6. The prediction date determines the period of time each respective selected optimization scenario is run on a simulator.

In step 512, the one or more selected optimization scenarios, the effect of each corresponding action on the selected zones, wells, patterns/clusters and/or fields on the prediction date, and an updated field development plan for the field with the respective net present value calculation and projected production parameters are displayed using the video interface described in reference to FIG. 6. The display may include, for example, changes in sweep efficiency health indicators, various subsurface visualization parameters for the selected zones, wells, patterns/clusters and/or fields, and various net present value derivatives for each selected optimization scenario. The optimization scenarios could include actions such as long term exploration strategies of secondary and tertiary oil recovery, infill drilling, re-drilling of water injection positions, and other field development actions.

In step 514, the method 500 determines whether optimization is desired based on the results of step 512. If optimization is desired, then the method 500 proceeds to step 516. If optimization is not desired, then the method 500 proceeds to step 518.

In step 516, the desired optimization scenario(s) may be selected from the one or more selected optimization scenarios for implementation using the client interface and/or the video interface described in reference to FIG. 6.

In step 518, the data underlying the results of step 512 is saved.

In step 520, the data underlying the results of step 512 selected in step 516 for implementation is saved.

In step 522, the method 500 determines whether the user has action approval to unilaterally implement the desired optimization scenario(s). If the user does not have the action approval, then the method 500 proceeds to step 524. If the user has action approval, then the method 500 proceeds to step 526.

In step 524, a request for implementation of the desired optimization scenario(s) may be generated and/or sent with a business case report, recommendation and analysis using the client interface and/or the video interface described in reference to FIG. 6.

In step 526, the corresponding action(s) for each desired optimization scenario to be implemented may be remotely executed or approved for manual implementation using the client interface and/or the video interface described in reference to FIG. 6.

System Description

The present invention may be implemented through a computer-executable program of instructions, such as program modules, generally referred to software applications or application programs executed by a computer. The software may include, for example, routines, programs, objects, components, and data structures that perform particular tasks or implement particular abstract data types. The software forms an interface to allow a computer to react according to a source of input. DECISIONSPACE, which is a commercial software application marketed by Landmark Graphics Corporation, may be used as an interface application to implement the present invention. The software may also cooperate with other code segments to initiate a variety of tasks in response to data received in conjunction with the source of the received data. Other code segments may provide optimization components including, but not limited to, neural networks, earth modeling, history matching, optimization, visualization, data management, reservoir simulation and economics. The software may be stored and/or carried on any variety of memory such as CD-ROM, magnetic disk, bubble memory and semiconductor memory (e.g., various types of RAM or ROM). Furthermore, the software and its results may be transmitted over a variety of carrier media such as optical fiber, metallic wire, and/or through any of a variety of networks, such as the Internet.

Moreover, those skilled in the art will appreciate that the invention may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Referring now to FIG. 6, a block diagram illustrates one embodiment of a system for implementing the present invention on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIG. 2. The memory therefore, includes a subsurface oil recovery optimization module, which enables the methods illustrated and described in reference to FIG. 2 and integrates functionality from the remaining application programs illustrated in FIG. 6. The subsurface oil recovery optimization module, for example, may be used, unlike the prior art, to execute many of the functions described in reference to steps 201, 202, 204, 206 (as to display), 208, 210, 212, 214, 218, 222, 302, 304 (as to display and ranking), 306 (user selection), 308 (as to selection), 310, 312 (as to display), 314, 316, 318, 320, 322, 324, 326, 402, 404 (as to display and ranking), 406 (user selection), 408 (as to selection), 410, 412 (as to display), 414, 416, 418, 420, 422, 424, 426, 502, 504 (as to display and ranking), 506 (user selection), 508 (as to selection), 510, 512 (as to display), and 514, 516, 518, 520, 522, 524, 526 in FIGS. 2, 3, 4 and 5. The memory also includes DECISIONSPACE, which may be used, for example, as an interface application to execute the functions described in reference to steps 206 (as to predicted sweep efficiency health), 304 (as the computation of ranked scenarios), 306 (advised actions), 308 (as to effects), 312 (as to predicted changes in sweep efficiency health indicators), 404 (as the computation of ranked scenarios), 406 (advised actions), 408 (as to effects), 412 (as to predicted changes in sweep efficiency health indicators), 504 (as the computation of ranked scenarios), 506 (advised actions), 508 (as to effects), and 512 (as to predicted changes in sweep efficiency health indicators) in FIGS. 2, 3, 4 and 5. Although DECISIONSPACE may be used as an interface application, other interface applications may be used, instead, or the subsurface oil recovery optimization module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/non-removable, volatile/nonvolatile computer storage media or they may be implemented in the computing unit through an application program interface ("API") or cloud computing, which may reside on a separate computing unit connected through a computer system or network. For example only, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, voice recognition or gesture recognition, or the like. These and other input devices are often connected to the processing unit through a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present invention has been described in connection with presently preferred embodiments, it will be understood by those skilled in the art that it is not intended to limit the invention to those embodiments. It is therefore, contemplated that various alternative embodiments and modifications may be made to the disclosed embodiments without departing from the spirit and scope of the invention defined by the appended claims and equivalents thereof.

What is claimed is:

1. A computer-implemented method, comprising:
receiving, using a processor, input corresponding to a selection of one or more zones, wells, patterns/clusters or fields of a hydrocarbon fluid reservoir, wherein the one or more zones, wells, patterns/clusters or fields is selected from a sweep efficiency health display, which comprises one of a current sweep efficiency health display and one of multiple predicted sweep efficiency health displays, and wherein the current sweep efficiency health display is based on current conditions data, which comprises real-time surveillance field data;
receiving field data associated with the selected one or more zones, wells, patterns/clusters or fields, the field data representing one or more real-time conditions existing within the selected one or more zones, wells, patterns/clusters or fields;
detecting an event using the field data associated with the selected one or more zones, wells, patterns/clusters or fields, the event representing a non-optimal condition of the selected one or more zones, wells, patterns/clusters or fields, and the non-optimal condition being below a performance threshold;
determining whether a cause of the non-optimal condition is immediately resolvable, the immediate resolution of the cause including an action that is performed in real-time as a reaction to the detected event, and the resolution of the non-optimal condition causing the non-optimal condition to meet or exceed the performance threshold;
in response to determining that the cause of the non-optimal condition is immediately resolvable, automatically selecting one or more scenarios from a plurality of scenarios, the plurality of scenarios being specific to the detected event, the selection of the one or more scenarios from the plurality of scenarios being based on the non-optimal condition, and each of the one or more selected scenarios corresponding to an action that optimizes the non-optimal condition in response to the detected event;
displaying a visual representation of the one or more selected scenarios, the visual representation indicating the action corresponding to each selected scenario, wherein the displayed one or more scenarios and corresponding actions are ranked according to at least one of net present value, increased oil recovery, and reduced recovery of unwanted gas or fluids;
receiving input corresponding to a selection of a scenario of the one or more selected scenarios;
determining, using the processor, an effect on the non-optimal condition of the action corresponding to the selected scenario, the determined effect simulating an improvement of the non-optimal condition from below the performance threshold to above the performance threshold;
displaying the action corresponding to the selected scenario; and automatically performing the action corresponding to the selected scenario, the performance of the action immediately resolving the non-optimal condition of the selected one or more zones, wells, patterns/clusters or fields, and the performance of the action improving a sweep efficiency health indicator of the hydrocarbon fluid reservoir.

2. The method of claim 1, further comprising determining if optimization is desired based on the one or more selected scenarios and the effect of the action on the one or more selected zones, wells, patterns/clusters or fields.

3. The method of claim 2, further comprising selecting the scenario from the one or more selected scenarios for implementation.

4. The method of claim 3, further comprising executing the corresponding action for each selected scenario as a short term optimization response to an undesirable sweep efficiency health indicator.

5. The method of claim 4, wherein the corresponding action for each selected scenario is remotely executed.

6. The method of claim 3, further comprising sending an approval for manual implementation of the corresponding action for each selected scenario.

7. The method of claim 3, further comprising sending a request for the implementation of the corresponding action for each selected scenario with a business case report and recommendation.

8. The method of claim 1, wherein the multiple displayed scenarios and corresponding actions are ranked for reactive-optimization.

9. The method of claim 1, further comprising running the one or more selected scenarios on a simulator in real-time to determine the effect of each corresponding action on the one or more selected zones, wells, patterns/clusters or fields on a prediction date.

10. The method of claim 1, further comprising diagnosing a cause of an undesirable sweep efficiency health indicator for the sweep efficiency health display using streamline numerical calculation to estimate correlation factors and well allocation factors.

11. The method of claim 1, wherein the displayed-scenarios and corresponding actions are based on one or more respective proxy models.

12. A non-transitory program carrier device for carrying computer executable instructions for short term oil recovery optimization, the instructions being executable to implement:
  receiving, using a processor, input corresponding to a selection of one or more zones, wells, patterns/clusters or fields of a hydrocarbon fluid reservoir, wherein the one or more zones, wells, patterns/clusters or fields is selected from a sweep efficiency health display, which comprises one of a current sweep efficiency health display and one of multiple predicted sweep efficiency health displays, and wherein the current sweep efficiency health display is based on current conditions data, which comprises real-time surveillance field data;
  receiving field data associated with the selected one or more zones, wells, patterns/clusters or fields, the field data representing one or more real-time conditions existing within the selected one or more zones, wells, patterns/clusters or fields;
  detecting an event using the field data associated with the selected one or more zones, wells, patterns/clusters or fields, the event representing a non-optimal condition of the selected one or more zones, wells, patterns/clusters or fields, and the non-optimal condition being below a performance threshold;
  determining whether a cause of the non-optimal condition is immediately resolvable, the immediate resolution of the cause including an action that is performed in real-time as a reaction to the detected event, and the resolution of the non-optimal condition causing the non-optimal condition to meet or exceed the performance threshold;
  in response to determining that the cause of the non-optimal condition is immediately resolvable, automatically selecting one or more scenarios from a plurality of scenarios, the plurality of scenarios being specific to the detected event, the selection of the one or more scenarios from the plurality of scenarios being based on the non-optimal condition, and each of the one or more selected scenarios corresponding to an action that optimizes the non-optimal condition in response to the detected event;
  displaying a visual representation of the one or more selected scenarios, the visual representation indicating the action corresponding to each selected scenario, wherein the displayed one or more scenarios and corresponding actions are ranked according to at least one of net present value, increased oil recovery, and reduced recovery of unwanted gas or fluids;
  receiving input corresponding to a selection of a scenario of the one or more selected;
  determining, using the processor, an effect on the non-optimal condition of the action corresponding to the selected scenario, the determined effect simulating an improvement of the non-optimal condition from below the performance threshold to above the performance threshold;
  displaying the effect of the action corresponding to the selected scenario; and
  automatically performing the action corresponding to the selected scenario, the performance of the action immediately resolving the non-optimal condition of the selected one or more zones, wells, patterns/clusters or fields, and the performance of the action improving a sweep efficiency health indicator of the hydrocarbon fluid reservoir.

13. The non-transitory program carrier device of claim 12, further comprising determining if optimization is desired based on the one or more selected scenarios and the effect of each corresponding action on the one or more selected zones, wells, patterns/clusters or fields.

14. The non-transitory program carrier device of claim 12, further comprising selecting the scenario from the one or more selected scenarios for implementation.

15. The non-transitory program carrier device of claim 14, further comprising executing the corresponding action for each selected scenario as a short term optimization response to an undesirable sweep efficiency health indicator.

16. The non-transitory program carrier device of claim 15, wherein the corresponding action for each selected scenario is remotely executed.

17. The non-transitory program carrier device of claim 14, further comprising sending an approval for manual implementation of the corresponding action for each selected scenario.

18. The non-transitory program carrier device of claim 14, further comprising sending a request for the implementation of the corresponding action for each scenario with a business case report and recommendation.

19. The non-transitory program carrier device of claim 12, wherein the multiple displayed scenarios and corresponding actions are ranked for reactive optimization.

20. The non-transitory program carrier device of claim 12, further comprising running the one or more selected scenarios on a simulator in real-time to determine the effect of each corresponding action on the one or more selected zones, wells, patterns/clusters or fields on a prediction date.

21. The non-transitory program carrier device of claim 12, further comprising diagnosing a cause of an undesirable sweep efficiency health indicator for the sweep efficiency health display using streamline numerical calculation to estimate correlation factors and well allocation factors.

22. The non-transitory program carrier device of claim 15, wherein the displayed-scenarios and corresponding actions are based on one or more respective proxy models.

\* \* \* \* \*